United States Patent
Ohashi et al.

(10) Patent No.: US 12,068,219 B2
(45) Date of Patent: Aug. 20, 2024

(54) HEAT SINK INTEGRATED INSULATING CIRCUIT BOARD

(71) Applicant: MITSUBISHI MATERIALS CORPORATION, Tokyo (JP)

(72) Inventors: Toyo Ohashi, Saitama (JP); Yoshiaki Sakaniwa, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 205 days.

(21) Appl. No.: 17/793,712

(22) PCT Filed: Feb. 19, 2021

(86) PCT No.: PCT/JP2021/006455
§ 371 (c)(1),
(2) Date: Jul. 19, 2022

(87) PCT Pub. No.: WO2021/182078
PCT Pub. Date: Sep. 16, 2021

(65) Prior Publication Data
US 2023/0071498 A1    Mar. 9, 2023

(30) Foreign Application Priority Data
Mar. 13, 2020    (JP) ................. 2020-044215

(51) Int. Cl.
*H05K 1/02* (2006.01)
*H01L 23/373* (2006.01)
*H05K 7/20* (2006.01)

(52) U.S. Cl.
CPC ...... *H01L 23/3735* (2013.01); *H01L 23/3736* (2013.01); *H05K 1/0204* (2013.01);
(Continued)

(58) Field of Classification Search
None
See application file for complete search history.

(56) References Cited

U.S. PATENT DOCUMENTS 9,480,144 B2 * 10/2016 Nagatomo ............ H01L 23/473
2007/0138624 A1    6/2007 Sudo et al.
(Continued)

FOREIGN PATENT DOCUMENTS

CN    106463477 A  *  2/2017 ........... C04B 35/645
JP    H11-204700 A    7/1999
(Continued)

OTHER PUBLICATIONS

Supplementary European Search Report mailed Mar. 14, 2024, issued for European Patent Application No. 21767952.1.
(Continued)

*Primary Examiner* — Timothy J. Dole
*Assistant Examiner* — Muhammed Azam
(74) *Attorney, Agent, or Firm* — Locke Lord LLP

(57) ABSTRACT

A heat sink integrated insulating circuit substrate includes: a heat sink including a top plate part and a cooling fin; an insulating resin layer formed on the top plate part of the heat sink; and a circuit layer made of metal pieces arranged on a surface of the insulating resin layer opposite to the heat sink, wherein, when a maximum length of the top plate part is defined as L, an amount of warpage of the top plate part is defined as Z, and deformation of protruding toward a bonding surface side of the top plate part of the heat sink is defined as a positive amount of warpage, and a curvature of the heat sink is defined as $C=|(8\times Z)/L^2|$, a ratio $P/C_{max}$ between a maximum curvature $C_{max}$ (1/m) of the heat sink during heating from 25° C. to 300° C. and peel strength P (N/cm) of the insulating resin layer satisfies $P/C_{max}>60$.

8 Claims, 4 Drawing Sheets

(52) U.S. Cl.
CPC .......... *H05K 1/0271* (2013.01); *H05K 7/205* (2013.01); *H05K 7/20509* (2013.01); *H05K 2201/068* (2013.01); *H05K 2201/09136* (2013.01)

(56) References Cited

U.S. PATENT DOCUMENTS

| | | | | |
|---|---|---|---|---|
| 2007/0274047 | A1* | 11/2007 | Nagase | C04B 37/026 |
| | | | | 29/851 |
| 2011/0017496 | A1* | 1/2011 | Hayashi | H01L 23/3735 |
| | | | | 174/250 |
| 2013/0335921 | A1* | 12/2013 | Nagatomo | H01L 23/3736 |
| | | | | 361/728 |
| 2014/0192486 | A1* | 7/2014 | Kuromitsu | B23K 35/0233 |
| | | | | 361/728 |
| 2016/0021729 | A1* | 1/2016 | Nagatomo | H05K 1/0203 |
| | | | | 174/257 |
| 2016/0181123 | A1* | 6/2016 | Terasaki | B23K 1/0016 |
| | | | | 228/122.1 |
| 2016/0219693 | A1* | 7/2016 | Nishimoto | H05K 1/0271 |
| 2018/0019182 | A1* | 1/2018 | Kato | H05K 1/0271 |
| 2020/0027815 | A1* | 1/2020 | Yumoto | H05K 3/0061 |
| 2020/0243409 | A1* | 7/2020 | Terasaki | C04B 37/026 |
| 2023/0071498 | A1* | 3/2023 | Ohashi | H01L 23/3735 |

FOREIGN PATENT DOCUMENTS

| | | | | |
|---|---|---|---|---|
| JP | 2001-057406 A | | 2/2001 | |
| JP | 2003-168770 A | | 6/2003 | |
| JP | 2004343035 A | * | 12/2004 | |
| JP | 2004356625 A | * | 12/2004 | .......... E02D 29/149 |
| JP | 2007299973 A | * | 11/2007 | |
| JP | 2014-167984 A | | 9/2014 | |
| JP | 2018-148064 A | | 9/2018 | |
| JP | 2019-041111 A | | 3/2019 | |
| JP | 2019-121794 A | | 7/2019 | |
| WO | WO-2011030754 A1 | * | 3/2011 | .......... C04B 37/026 |
| WO | WO-2014148420 A1 | * | 9/2014 | .......... B23K 1/0006 |
| WO | WO-2015122446 A1 | * | 8/2015 | .......... C04B 37/003 |
| WO | WO-2016002803 A1 | * | 1/2016 | .......... C04B 35/645 |
| WO | WO-2018159590 A1 | * | 9/2018 | ............. C04B 37/02 |
| WO | WO-2018163865 A1 | * | 9/2018 | ......... H01L 21/4882 |

OTHER PUBLICATIONS

International Search Report mailed May 11, 2021, issued for PCT/JP2021/006455 and English translation thereof.

* cited by examiner

HEAT SINK INTEGRATED INSULATING CIRCUIT BOARD

TECHNICAL FIELD

The present invention relates to a heat sink integrated insulating circuit substrate including a heat sink including a cooling fin, an insulating resin layer formed on a top plate part of the heat sink, and a circuit layer formed on one surface of the insulating resin layer.

The present application claims priority on Japanese Patent Application No. 2020-044215 filed on Mar. 13, 2020, the content of which is incorporated herein by reference.

BACKGROUND ART

A power module, an LED module, and a thermoelectric module have a structure in which a power semiconductor element, an LED element, and a thermoelectric element are bonded to an insulating circuit substrate, and in the insulating circuit substrate, a circuit layer made of a conductive material is formed on one surface of an insulating layer. As the insulating layer, one using ceramics or one using an insulating resin has been proposed.

As the insulating circuit substrate including the insulating resin layer, for example, Patent Document 1 proposes a cooling fin integrated insulating circuit substrate in which a heat sink including a cooling fin and a circuit layer are insulated by an insulating resin sheet.

Further, Patent Document 2 discloses a composite part in which a radiating base substrate is adhered to at least one surface of a heat generation member via a heat conductive insulating adhesive film. In Patent Document 2, a relationship between shear adhesive strength and thermal stress and a relationship between breaking elongation and thermal strain are defined in order to suppress an occurrence of a crack in the heat conductive insulating adhesive film due to stress generated from the expansion or contraction of a radiating member and the heat generation member due to a temperature change.

PRIOR ART DOCUMENTS

Patent Document

Patent Document 1: Japanese Unexamined Patent Application, First Publication No. H11-204700
Patent Document 2: Japanese Unexamined Patent Application, First Publication No. 2019-041111

DISCLOSURE OF INVENTION

Problems to be Solved by the Invention

Meanwhile, in a heat sink integrated insulating circuit substrate in which an insulating resin layer is formed on a top plate part of a heat sink including a cooling fin and a circuit layer is formed on the insulating resin layer, warpage may occur due to a temperature change. In particular, in the heat sink including the cooling fin, the thickness differs between a place at which the cooling fin is formed and a place at which the cooling fin is not formed. Thus, the warpage tends to occur easily.

When the heat sink integrated insulating circuit substrate is warped, there is a concern that the end of the circuit layer is peeled from the insulating resin layer or such peeling proceeds to the inside of the insulating resin layer.

In Patent Document 2, the stress and strain in the surface are evaluated, but the stress in a direction orthogonal to the surface is not considered. Therefore, the peeling of the circuit layer and the internal peeling of the insulating resin layer are not supported.

The present invention has been made in view of the above-described circumstances, and an objective of the present invention is to provide a heat sink integrated insulating circuit substrate capable of suppressing an occurrence of peeling between a circuit layer and an insulating resin layer or an occurrence of internal peeling of the insulating resin layer and having excellent reliability, even when warpage occurs due to a temperature change.

Solutions for Solving the Problems

In order to solve the above-described problems, according to the present invention, a heat sink integrated insulating circuit substrate includes a heat sink including a top plate part and a cooling fin, an insulating resin layer formed on the top plate part of the heat sink, and a circuit layer made of metal pieces arranged in a circuit pattern on a surface of the insulating resin layer opposite to the heat sink. When a maximum length of the top plate part of the heat sink is defined as L, an amount of warpage of the top plate part of the heat sink is defined as Z, and deformation of protruding toward a bonding surface side between the top plate part of the heat sink and the insulating resin layer is defined as a positive amount of warpage, and a curvature of the heat sink is defined as $C=|(8 \times Z)/L^2|$, a ratio $P/C_{max}$ between a maximum curvature $C_{max}$ (1/m) of the heat sink during heating from 25° C. to 300° C. and peel strength P (N/cm) of the insulating resin layer satisfies $P/C_{max} > 60$.

According to the heat sink integrated insulating circuit substrate having such a configuration, since the ratio $P/C_{max}$ between the maximum curvature $C_{max}$ (1/m) of the heat sink during heating from 25° C. to 300° C. and peel strength P (N/cm) of the insulating resin layer satisfies $P/C_{max} > 60$, sufficient peel strength is secured against the stress due to warpage. In addition, even when the heat sink is warped due to a temperature change, it is possible to suppress the occurrence of peeling between a circuit layer and an insulating resin layer or an occurrence of internal peeling of the insulating resin layer.

In the heat sink integrated insulating circuit substrate in the present invention, a ratio $t_C/t_H$ between a thickness $t_C$ of the circuit layer and a thickness $t_H$ of the top plate part of the heat sink may satisfy $0.5 \le t_C/t_H \le 1.5$.

In this case, the ratio $t_C/t_H$ between the thickness $t_C$ of the circuit layer disposed via the insulating resin layer and the thickness $t_H$ of the top plate part of the heat sink has no big difference, and thus it is possible to suppress the amount of warpage relatively low.

Further, in the heat sink integrated insulating circuit substrate in the present invention, the ratio $P/C_{max}$ between the maximum curvature $C_{max}$ (1/m) of the heat sink during heating from 25° C. to 300° C. and the peel strength P (N/cm) of the insulating resin layer may satisfy $P/C_{max} > 90$.

In this case, the sufficient peel strength is secured against the stress due to the warpage, and, even when the heat sink is warped due to a temperature change, it is possible to suppress the occurrence of peeling between the circuit layer and the insulating resin layer, or the occurrence of internal peeling of the insulating resin layer.

Further, in the heat sink integrated insulating circuit substrate in the present invention, the insulating resin layer may contain a filler of an inorganic material.

In this case, since the thermal conductivity of the insulating resin layer is secured, the heat radiating characteristics are excellent, and it is possible to radiate heat from a heat source mounted on the circuit layer to the heat sink side with high efficiency.

Effects of Invention

According to the present invention, it is possible to provide a heat sink integrated insulating circuit substrate capable of suppressing the occurrence of peeling between the circuit layer and the insulating resin layer or the occurrence of internal peeling of the insulating resin layer and having excellent reliability, even when warpage occurs due to a temperature change.

EMBODIMENTS FOR CARRYING OUT THE INVENTION

Hereinafter, an embodiment of the present invention will be described with reference to the accompanying drawings.

Figure 1:
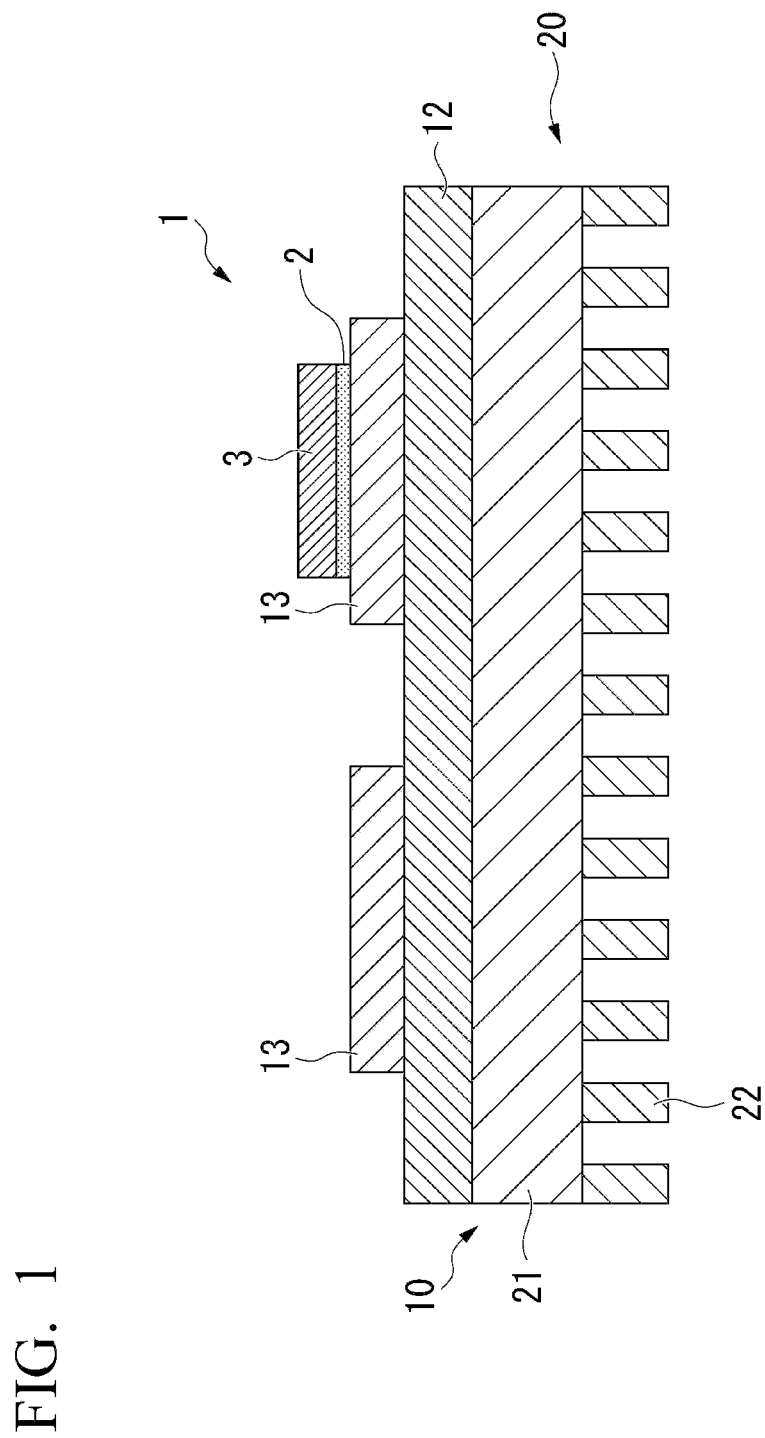
FIG. 1 is a schematic diagram of a power module including a heat sink integrated insulating circuit substrate according to an embodiment of the present invention.

FIG. 1 represents a heat sink integrated insulating circuit substrate 10 according to an embodiment of the present invention and a power module 1 using the heat sink integrated insulating circuit substrate 10.

The power module 1 represented in FIG. 1 includes the heat sink integrated insulating circuit substrate 10 and a semiconductor element 3 bonded to one surface (upper surface in FIG. 1) of the heat sink integrated insulating circuit substrate 10 via a solder layer 2.

The semiconductor element 3 is made of a semiconductor material such as Si. The solder layer 2 that bonds the heat sink integrated insulating circuit substrate 10 and the semiconductor element 3 to each other is made of, for example, a Sn—Ag-based, Sn—Cu-based, Sn—In-based, or Sn—Ag—Cu-based solder material (so-called a lead-free solder material).

The heat sink integrated insulating circuit substrate 10 includes a heat sink 20, an insulating resin layer 12 formed on one surface (upper surface in FIG. 1) of a top plate part 21 of the heat sink 20, and a circuit layer 13 formed on one surface (upper surface in FIG. 1) of the insulating resin layer 12. The above-described semiconductor element 3 is bonded to one surface (upper surface in FIG. 1) of the circuit layer 13.

The heat sink 20 includes the top plate part 21 and a cooling fin 22 protruding from the other surface (lower surface in FIG. 1) of the top plate part 21.

The heat sink 20 has a configuration in which heat is spread in the top plate part 21 in a surface direction and is radiated to the outside via the cooling fin 22. Therefore, the heat sink 20 is made of metal having excellent thermal conductivity, for example, copper, a copper alloy, aluminum, or an aluminum alloy. In the present embodiment, the heat sink 20 is made of an aluminum alloy (A6063).

It is preferable that the thickness of the top plate part 21 of the heat sink 20 is set to be in a range of 0.5 mm or more and 6.0 mm or less.

The heat sink 20 may have a structure in which the cooling fins 22 are pin fins, or have a structure in which the cooling fins 22 are formed in a comb shape. Further, it is preferable that a volume ratio occupied by the cooling fin 22 in a place where the cooling fin 22 is formed is in a range of 10% or more and 40% or less.

The insulating resin layer 12 prevents an electrical connection between the circuit layer 13 and the heat sink 20, and includes an insulating resin.

In the present embodiment, it is preferable to use a resin containing a filler of an inorganic material in order to secure the strength of the insulating resin layer 12 and to secure the thermal conductivity. As the filler, for example, alumina, boron nitride, aluminum nitride, or the like can be used. From the viewpoint of securing the thermal conductivity in the insulating resin layer 12, the content of the filler is preferably 50 mass % or more, and more preferably 70 mass % or more. The upper limit of the content of the filler is not particularly limited, but may be 95 mass % or less.

Further, as a thermosetting resin, an epoxy resin, a polyimide resin, a silicon resin, or the like can be used. When the thermosetting resin is a silicon resin, the thermosetting resin can contain 70 mass % or more of the filler, and, when the thermosetting resin is an epoxy resin, the thermosetting resin can contain 80 mass % or more of the filler. The upper limit of the content of the filler is not particularly limited, but may be 95 mass % or less.

In order to sufficiently secure the insulating property of the insulating resin layer 12, the lower limit of the thickness of the insulating resin layer 12 is preferably set to 25 μm or more, and more preferably 50 μm or more. On the other hand, in order to further secure the heat radiation in the heat sink integrated insulating circuit substrate 10, the upper limit of the thickness of the insulating resin layer 12 is preferably set to 300 μm or less, and more preferably 200 μm or less.

Figure 5:
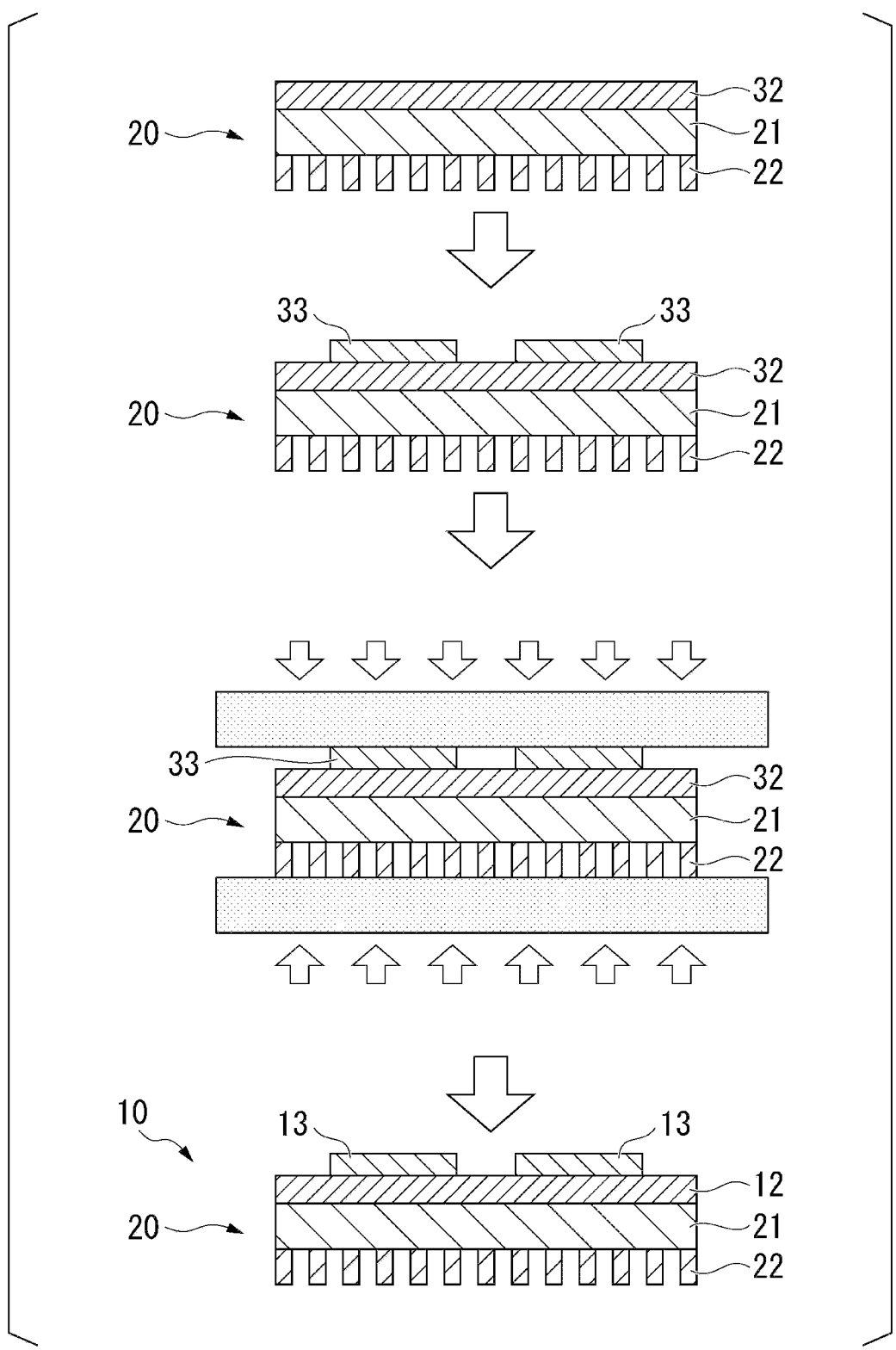
FIG. 5 is a schematic diagram of the method for manufacturing the heat sink integrated insulating circuit substrate represented in FIG. 4.

As represented in FIG. 5, the circuit layer 13 is formed by bonding a metal piece 33 made of metal having excellent electrical conductivity to one surface (upper surface in FIG. 5) of the insulating resin layer 12. As the metal piece 33, copper, a copper alloy, aluminum, an aluminum alloy, or the like can be used. In the present embodiment, as the metal piece 33 constituting the circuit layer 13, a metal piece obtained by punching out a rolled plate of oxygen-free copper is used.

In the circuit layer 13, a circuit pattern is formed, and one surface (upper surface in FIG. 1) of the circuit pattern is used as a mounting surface on which the semiconductor element 3 is mounted.

In the heat sink integrated insulating circuit substrate 10 of the present embodiment, a ratio $t_C/t_H$ between a thickness $t_C$ of the circuit layer 13 (metal piece 33) and a thickness $t_H$ of the top plate part 21 of the heat sink 20 preferably satisfies $0.5 \leq t_C/t_H \leq 1.5$.

Specifically, the thickness $t_C$ of the circuit layer 13 (metal piece 33) is set to be in a range of 0.3 mm or more and 3.0 mm or less. The thickness $t_H$ of the top plate part 21 of the heat sink 20 is set to be in a range of 0.5 mm or more and 6.0 mm or less, and preferably, the above-described ratio $t_C/t_H$ is satisfied.

In the heat sink integrated insulating circuit substrate 10 of the present embodiment, when the maximum length of the top plate part 21 of the heat sink 20 (maximum length on the surface perpendicular to a laminating direction of the heat sink integrated insulating circuit substrate 10) is defined as L, the amount of warpage of the top plate part 21 of the heat sink 20 is defined as Z, deformation of protruding toward a bonding surface side of the top plate part 21 of the heat sink 20 is defined as a positive amount of warpage, and curvature of the heat sink 20 is defined as $C=|(8\times Z)/L^2|$, a ratio $P/C_{max}$ between the maximum curvature $C_{max}$ (1/m) of the heat sink 20 during heating from 25° C. to 300° C. and peel strength P (N/cm) of the insulating resin layer 12 is set to $P/C_{max}>60$. Further, although the upper limit is not particularly limited, the ratio $P/C_{max}$ may be $P/C_{max}<1000$.

Figure 2:
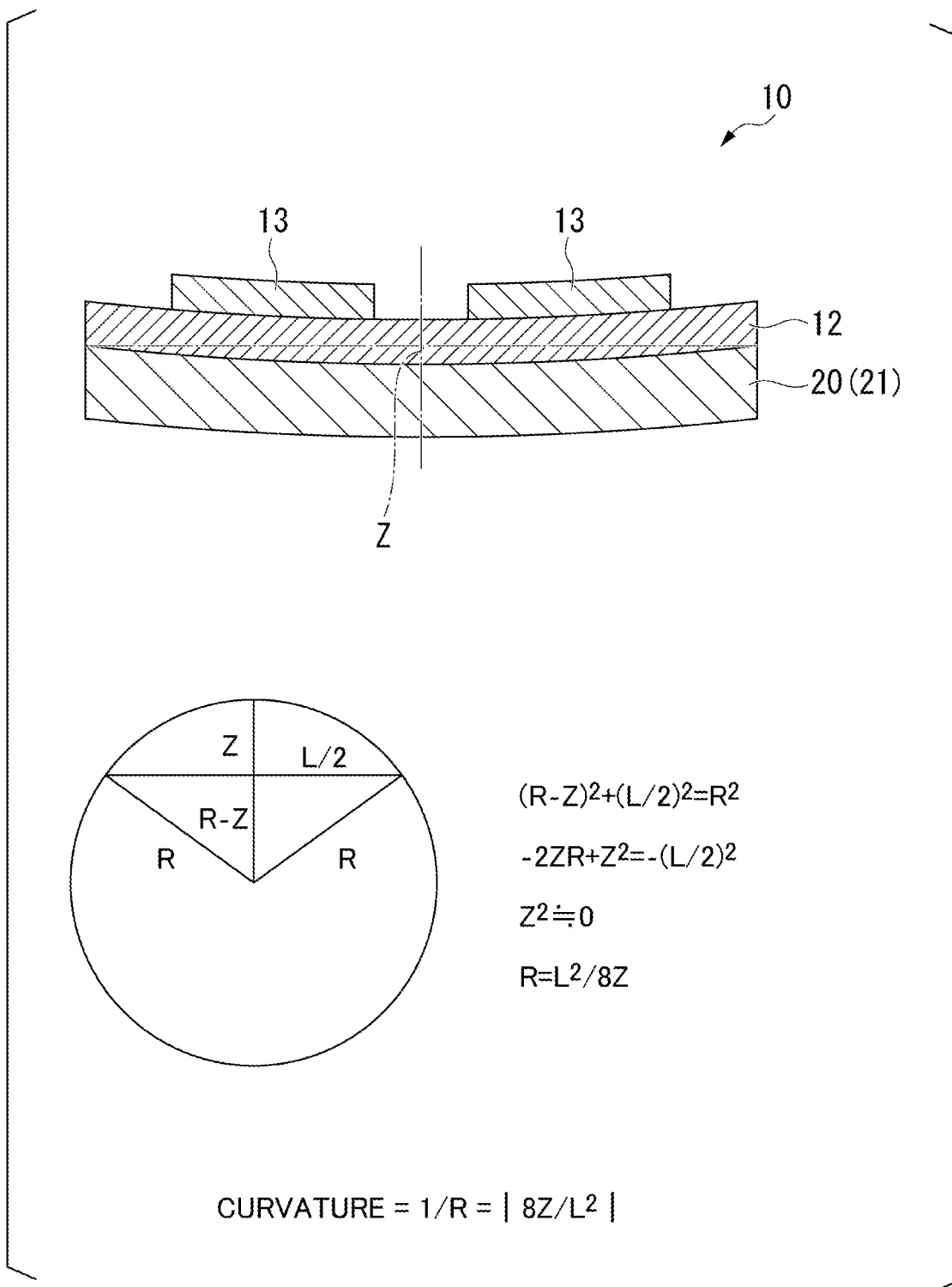
FIG. 2 is a diagram representing a relationship between an amount of warpage and curvature in the heat sink integrated insulating circuit substrate according to the embodiment of the present invention.

As represented in FIG. 2, the curvature C of the heat sink $20=|(8\times Z)/L^2|$ is calculated from the maximum length L of the top plate part 21 of the heat sink 20 and the amount of warpage Z of the top plate part 21 of the heat sink 20.

In the present embodiment, the top plate part 21 of the heat sink 20 has a rectangular flat plate shape, and the diagonal length is the maximum length L. The amount of warpage Z is a difference between the maximum value and the minimum value in a height direction in a cross section along a diagonal line (maximum length).

Figure 3:
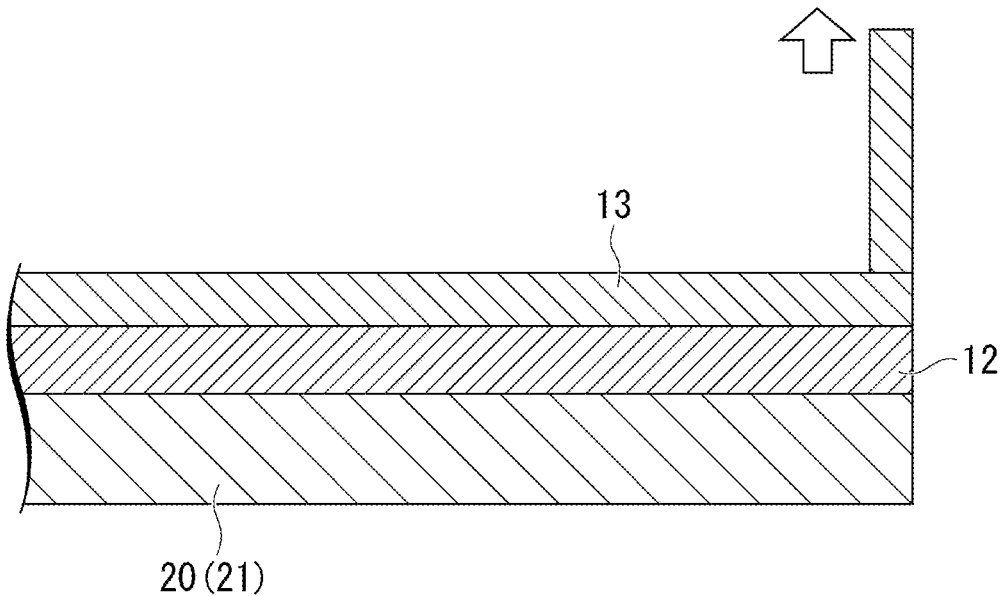
FIG. 3 is a diagram of a method for measuring peel strength of an insulating resin layer in the heat sink integrated insulating circuit substrate according to the embodiment of the present invention.

Further, as represented in FIG. 3, the peel strength of the insulating resin layer 12 is measured in accordance with a 90° peel test defined in JIS K6854-1: 1999, by pulling upward the end of the circuit layer 13 (metal piece 33).

In such a peel test, the breaking place may be any of a bonding interface between the top plate part 21 of the heat sink 20 and the insulating resin layer 12, a bonding interface between the insulating resin layer 12 and the circuit layer 13, and the inside of the insulating resin layer 12.

When the ratio $P/C_{max}$ between the maximum curvature $C_{max}$ (1/m) of the heat sink 20 during heating up to 300° C. and the peel strength P (N/cm) of the insulating resin layer 12 satisfies $P/C_{max}>60$, the peel strength is higher than the stress in a height direction due to the warpage, and the peeling of the insulating resin layer 12 and the like due to warpage is suppressed.

Thus, the material of the resin constituting the insulating resin layer 12 may be optimized according to the amount of warpage, or the material and thickness of the circuit layer 13 and the heat sink 20 may be designed in accordance with the material of the resin constituting the insulating resin layer 12 to satisfy $P/C_{max}>60$, and thus it is possible to suppress peeling of the insulating resin layer 12 and the like due to warpage.

In order to more reliably suppress the peeling of the insulating resin layer 12 and the like due to warpage, it is preferable to set the above-described ratio $P/C_{max}$ to be larger than 90.

Next, a method for manufacturing the heat sink integrated insulating circuit substrate 10 according to the present embodiment will be described with reference to FIGS. 4 and 5.

(Resin Composition Arrangement Step S01)

As represented in FIG. 5, a resin composition 32 containing a filler of an inorganic material, a resin, and a curing agent is arranged on one surface (upper surface in FIG. 5) of the top plate part 21 of the heat sink 20. In the present embodiment, the resin composition 32 is in a form of a sheet.

(Metal Piece Disposition Step S02)

Then, a plurality of metal pieces 33 serving as the circuit layer 13 are disposed in a circuit pattern on one surface (upper surface in FIG. 5) of the resin composition 32.

(Pressurization and Heating Step S03)

Then, the heat sink 20, the resin composition 32, and the metal pieces 33 are heated in a state where they are pressed in the laminating direction by a pressurizing device to cure the resin composition 32; and thereby, the insulating resin layer 12 is formed, and in addition, the top plate part 21 of the heat sink 20 and the insulating resin layer 12 are bonded, and the insulating resin layer 12 and the metal pieces 33 are bonded.

In the pressurization and heating step S03, it is preferable that a heating temperature is set to be in a range of 120° C. or higher and 350° C. or lower, and a holding time at the heating temperature is set to be in a range of 10 minutes or longer and 180 minutes or lower. Further, it is preferable that the pressurizing load in the laminating direction is set to be in a range of 1 MPa or more and 30 MPa or less.

The lower limit of the heating temperature is more preferably set to 150° C. or higher, and still more preferably 170° C. or higher. On the other hand, the upper limit of the heating temperature is more preferably set to 320° C. or lower, and still more preferably 300° C. or lower.

The lower limit of the holding time at the heating temperature is more preferably set to 30 minutes or longer, and still more preferably 60 minutes or longer. On the other hand, the upper limit of the holding time at the heating temperature is more preferably set to 120 minutes or shorter, and still more preferably 90 minutes or shorter.

The lower limit of the pressurizing load in the laminating direction is more preferably set to 3 MPa or more, and still more preferably set to 5 MPa or more. On the other hand, the upper limit of the pressurizing load in the laminating direction is more preferably set to 15 MPa or less, and still more preferably set to 10 MPa or less.

With each step described above, the heat sink integrated insulating circuit substrate 10 according to the present embodiment is manufactured.

According to the heat sink integrated insulating circuit substrate 10 having the above-described configuration according to the present embodiment, since the ratio $P/C_{max}$ between the maximum curvature $C_{max}$ (1/m) of the heat sink 20 during heating from 25° C. to 300° C. and peel strength P (N/cm) of the insulating resin layer 12 satisfies $P/C_{max}>60$, sufficient peel strength is secured against the stress due to warpage. In addition, even when the heat sink 20 is warped due to a temperature change, it is possible to suppress the occurrence of peeling between the circuit layer 13 and the insulating resin layer 12 or an occurrence of internal peeling of the insulating resin layer 12.

Further, in the present embodiment, when the ratio $t_C/t_H$ between the thickness $t_C$ of the circuit layer 13 and the thickness $t_H$ of the top plate part 21 of the heat sink 20 satisfies $0.5 \leq t_C/t_H \leq 1.5$, the ratio $t_C/t_H$ between the thickness $t_C$ of the circuit layer 13 disposed via the insulating resin layer 12 and the thickness $t_H$ of the top plate part 21 of the heat sink 20 has no large difference, and it is possible to suppress the amount of warpage relatively low.

Further, in the present embodiment, when the insulating resin layer 12 contains the filler of an inorganic material, the thermal conductivity of the insulating resin layer 12 is secured, the heat radiating characteristics are excellent, and it is possible to radiate the heat from the semiconductor element 3 mounted on the circuit layer 13 to the heat sink 20 side with high efficiency.

Although the embodiment of the present invention has been described above, the present invention is not limited to the above description, and can be appropriately changed without departing from the technical features of the invention.

Figure 4:
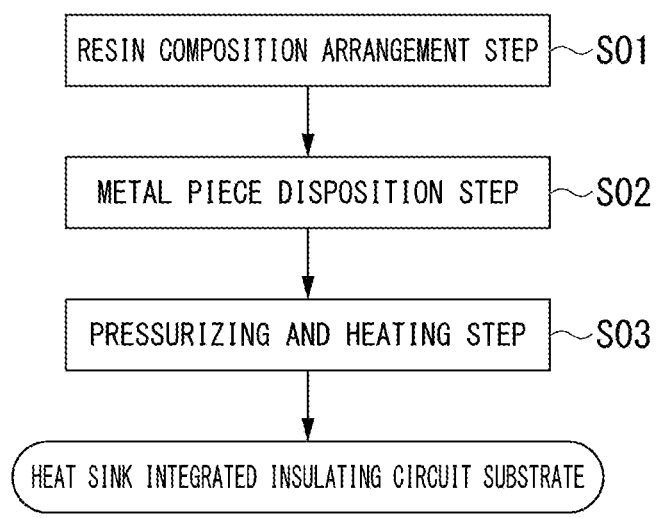
FIG. 4 is a flowchart representing an example of a method for manufacturing a heat sink integrated insulating circuit substrate according to the embodiment of the present invention.

In the present embodiment, a case where the heat sink integrated insulating circuit substrate is manufactured by using the method for manufacturing the heat sink integrated insulating circuit substrate represented in FIGS. 4 and 5 has been described, but the present invention is not limited to this.

Further, in the present embodiment, a case where the heat sink is made of oxygen-free copper (OFC) and the circuit layer is made of an aluminum alloy (A6053) has been described, but the present invention is not limited to this, and the heat sink or the circuit layer may be made of other types of metal such as copper, a copper alloy, aluminum, or an aluminum alloy. Further, the heat sink or the circuit layer may have a structure in which a plurality of kinds of metal are laminated.

Further, in the present embodiment, a case where the semiconductor element is configured to be mounted on the heat sink integrated insulating circuit substrate to form the power module has been described, but the present invention is not limited to this. For example, an LED element may be mounted on the circuit layer of the heat sink integrated insulating circuit substrate to form an LED module, or a thermoelectric element may be mounted on the circuit layer of the heat sink integrated insulating circuit substrate to form a thermoelectric module.

EXAMPLES

The results of the confirmation experiment conducted to confirm the effect of the present invention will be described below.

A sheet material of a resin composition shown in Table 1 was disposed on the top plate part (100 mm×80 mm, thickness is shown in Table 1) of the heat sink having the structure shown in Table 1, and a metal piece forming the circuit layer shown in Table 1 was disposed on the sheet material of the resin composition. The heat sink, the sheet material of the resin composition, and the metal piece, which had been laminated, were heated while pressurizing in the laminating direction to cure the resin composition; and thereby, the insulating resin layer was formed, and in addition, the top plate part of the heat sink and the insulating resin layer were bonded, and the insulating resin layer and the metal piece were bonded. As a result, a heat sink integrated insulating circuit substrate was obtained. When the sheet material was polyimide, the pressurizing pressure in the laminating direction was set to 5 MPa, the heating temperature was set to 300° C., and the holding time at the heating temperature was set to 60 minutes. When the sheet material was epoxy or silicon, the pressurizing pressure in the laminating direction was set to 10 MPa, the heating temperature was set to 200° C., and the holding time at the heating temperature was set to 60 minutes.

The heat sink integrated insulating circuit substrate obtained as described above was evaluated for the following items.

(Maximum Curvature $C_{max}$)

The amount of warpage Z during heating up to 300° C. was measured by using a moire-type three-dimensional shape measuring instrument (THERMOIRE PS200 manufactured by AKROMETRIX).

Then, as described in the section "EMBODIMENTS FOR CARRYING OUT THE INVENTION", the maximum curvature $C_{max}$ (1/m) of the heat sink during heating from 25° C. to 300° C. was calculated from the maximum length L of the top plate part 21 of the heat sink and the amount of warpage Z.

(Peel Strength P)

As described in the section "EMBODIMENTS FOR CARRYING OUT THE INVENTION", measurement was performed in accordance with the 90° peel test defined in JIS K6854-1: 1999, by pulling upward the end of the circuit layer (metal piece).

(Breaking After Heating Treatment)

The obtained heat sink integrated insulating circuit substrate was heat-treated at 300° C. for 5 minutes, and the presence or absence of breaking of the insulating resin layer was confirmed. The heat sink integrated insulating circuit substrate with breaking was indicated as "presence", and the heat sink integrated insulating circuit substrate without breaking was indicated as "absence".

Table 2 shows the evaluation results of the maximum curvature $C_{max}$, the peel strength P, and the breaking after the heating treatment.

TABLE 1

| | | Circuit layer | | Heat sink Top plate part | | | Insulating resin layer | | | | |
|---|---|---|---|---|---|---|---|---|---|---|---|
| | | Material | Thickness $t_C$ (mm) | Material | thickness $t_H$ (mm) | Fin shape | Volume ratio of fin | Thickness ratio $t_C/t_H$ | Resin material | Filler Type | Filler Content (mass %) | Thickness (mm) |
| Invention Examples | 1 | OFC | 1.0 | OFC | 1.0 | Pin fin | 0.18 | 1.00 | Epoxy | $Al_2O_3$, BN | 80 | 0.15 |
| | 2 | OFC | 1.0 | OFC | 2.0 | Pin fin | 0.18 | 0.50 | Epoxy | $Al_2O_3$, BN | 82 | 0.15 |
| | 3 | OFC | 1.0 | OFC | 3.0 | Pin fin | 0.18 | 0.33 | Epoxy | $Al_2O_3$, BN | 82 | 0.14 |
| | 4 | OFC | 1.0 | OFC | 5.0 | Pin fin | 0.18 | 0.20 | Epoxy | $Al_2O_3$, BN | 83 | 0.13 |
| | 5 | OFC | 1.5 | OFC | 1.0 | Pin fin | 0.18 | 1.50 | Epoxy | $Al_2O_3$, BN | 81 | 0.14 |
| | 6 | OFC | 1.0 | A6063 | 1.0 | Pin fin | 0.18 | 1.00 | Polyimide | BN | 60 | 0.05 |
| | 7 | OFC | 1.0 | A6063 | 2.0 | Pin fin | 0.18 | 0.50 | Polyimide | BN | 61 | 0.05 |
| | 8 | OFC | 1.0 | A6063 | 3.0 | Pin fin | 0.18 | 0.33 | Polyimide | BN | 58 | 0.07 |
| | 9 | OFC | 1.0 | A6063 | 5.0 | Pin fin | 0.18 | 0.20 | Polyimide | BN | 59 | 0.05 |
| | 10 | OFC | 1.5 | A6063 | 1.0 | Pin fin | 0.18 | 1.50 | Polyimide | BN | 60 | 0.05 |
| | 11 | OFC | 1.0 | A6063 | 1.0 | Pin fin | 0.18 | 1.00 | Epoxy | $Al_2O_3$, BN | 81 | 0.16 |

TABLE 1-continued

| | | Heat sink | | | | | | | | | |
|---|---|---|---|---|---|---|---|---|---|---|---|
| | | Circuit layer | | Top plate part | | | Volume ratio of fin | Thickness ratio $t_C/t_H$ | Insulating resin layer | | |
| | | Material | Thickness $t_C$ (mm) | Material | thickness $t_H$ (mm) | Fin shape | | | Resin material | Filler Type | Content (mass %) | Thickness (mm) |

| | | Material | $t_C$ (mm) | Material | $t_H$ (mm) | Fin shape | fin | $t_C/t_H$ | Resin | Type | (mass %) | (mm) |
|---|---|---|---|---|---|---|---|---|---|---|---|---|
| Invention Examples | 12 | OFC | 1.0 | A6063 | 2.0 | Pin fin | 0.18 | 0.50 | Epoxy | Al$_2$O$_3$, BN | 83 | 0.16 |
| | 13 | A6063 | 1.5 | A6063 | 2.0 | Pin fin | 0.18 | 0.75 | Epoxy | Al$_2$O$_3$, BN | 83 | 0.15 |
| | 14 | OFC | 1.0 | OFC | 3.0 | Pin fin | 0.18 | 0.33 | Silicon | BN | 65 | 0.30 |
| | 15 | OFC | 1.0 | A6063 | 3.0 | Pin fin | 0.18 | 0.33 | Silicon | BN | 67 | 0.30 |
| | 16 | OFC | 1.0 | A6063 | 2.0 | Comb shape | 0.25 | 0.50 | Polyimide | BN | 58 | 0.05 |
| | 17 | OFC | 1.0 | A6063 | 3.0 | Comb shape | 0.25 | 0.33 | Polyimide | BN | 60 | 0.07 |
| | 18 | OFC | 1.0 | A6063 | 2.0 | Comb shape | 0.25 | 0.50 | Epoxy | Al$_2$O$_3$, BN | 82 | 0.16 |
| Comparative Examples | 1 | OFC | 1.0 | A6063 | 3.0 | Pin fin | 0.18 | 0.33 | Epoxy | Al$_2$O$_3$, BN | 81 | 0.15 |
| | 2 | OFC | 1.0 | A6063 | 5.0 | Pin fin | 0.18 | 0.20 | Epoxy | Al$_2$O$_3$, BN | 80 | 0.13 |
| | 3 | A6063 | 1.5 | A6063 | 4.0 | Pin fin | 0.18 | 0.38 | Epoxy | Al$_2$O$_3$, BN | 79 | 0.14 |
| | 4 | OFC | 0.3 | A6063 | 1.0 | Pin fin | 0.18 | 0.30 | Silicon | BN | 68 | 0.30 |
| | 5 | OFC | 1.0 | A6063 | 3.0 | Comb shape | 0.25 | 0.33 | Epoxy | Al$_2$O$_3$, BN | 84 | 0.15 |

TABLE 2

| | | Maximum curvature $C_{max}$ (1/m) | Peel strength P (N/cm) | $P/C_{max}$ | Breaking after heating treatment |
|---|---|---|---|---|---|
| Invention Examples | 1 | 0.032 | 5.5 | 171.9 | None |
| | 2 | 0.045 | 5.6 | 125.0 | None |
| | 3 | 0.056 | 5.8 | 103.6 | None |
| | 4 | 0.059 | 6.0 | 101.4 | None |
| | 5 | 0.043 | 5.9 | 137.2 | None |
| | 6 | 0.056 | 12.5 | 223.2 | None |
| | 7 | 0.069 | 12.2 | 177.3 | None |
| | 8 | 0.128 | 12.3 | 96.1 | None |
| | 9 | 0.144 | 13.1 | 91.0 | None |
| | 10 | 0.065 | 13.0 | 200.0 | None |
| | 11 | 0.051 | 5.2 | 101.6 | None |
| Invention Examples | 12 | 0.069 | 5.3 | 77.0 | None |
| | 13 | 0.032 | 5.5 | 171.9 | None |
| | 14 | 0.064 | 13.8 | 215.6 | None |
| | 15 | 0.064 | 13.7 | 214.1 | None |
| | 16 | 0.080 | 12.2 | 152.5 | None |
| | 17 | 0.128 | 12.3 | 96.1 | None |
| | 18 | 0.069 | 5.3 | 77.0 | None |
| Comparative Examples | 1 | 0.125 | 5.7 | 45.7 | Occurring |
| | 2 | 0.142 | 6.0 | 42.1 | Occurring |
| | 3 | 0.120 | 5.8 | 48.3 | Occurring |
| | 4 | 0.320 | 13.9 | 43.4 | Occurring |
| | 5 | 0.125 | 5.7 | 45.7 | Occurring |

According to Table 2, in Comparative Examples 1 to 5 in which the ratio $P/C_{max}$ between the maximum curvature $C_{max}$ (1/m) of the heat sink during heating from 25° C. to 300° C. and the peel strength P (N/cm) of the insulating resin layer was 60 or less, breaking was observed after a heating test.

On the other hand, in Examples 1 to 18 of the present invention in which the ratio $P/C_{max}$ between the maximum curvature $C_{max}$ (1/m) of the heat sink during heating from 25° C. to 300° C. and the peel strength P (N/cm) of the insulating resin layer was more than 60, no breaking was observed after the heating test. In addition, even when the resin material was changed, the occurrence of breaking after the heating test could be suppressed by optimizing the maximum curvature (amount of warpage) and setting $P/C_{max}$ to be more than 60.

Hitherto, according to the example of the present invention, it is confirmed that it is possible to provide a heat sink integrated insulating circuit substrate capable of suppressing the occurrence of peeling between the circuit layer and the insulating resin layer or the occurrence of internal peeling of the insulating resin layer, and having excellent reliability, even when warpage occurs due to a temperature change.

INDUSTRIAL APPLICABILITY

According to the heat sink integrated insulating circuit substrate of the present invention, it is possible to suppress the occurrence of internal peeling of the insulating resin layer constituting a power module, an LED module, a thermoelectric module, and the like, and it is possible to improve the reliability. Therefore, the heat sink integrated insulating circuit substrate of the present invention has industrial applicability.

EXPLANATION OF REFERENCE SIGNS

10: Heat sink integrated insulating circuit substrate
12: Insulating resin layer
13: Circuit layer
20: Heat sink
21: Top plate part
22: Cooling fin

What is claimed is:

1. A heat sink integrated insulating circuit substrate comprising:
   a heat sink including a top plate part and a cooling fin;
   an insulating resin layer formed on the top plate part of the heat sink; and
   a circuit layer made of metal pieces arranged in a circuit pattern on a surface of the insulating resin layer opposite to the heat sink,
   wherein, when a maximum length of the top plate part of the heat sink is defined as L, an amount of warpage of the top plate part of the heat sink is defined as Z, and deformation of protruding toward a bonding surface side between the top plate part of the heat sink and the insulating resin layer is defined as a positive amount of warpage, and a curvature of the heat sink is defined as $C=|(8\times Z)/L^2|$,
   a ratio $P/C_{max}$ between a maximum curvature $C_{max}$ (1/m) of the heat sink during heating from 25° C. to 300° C. and peel strength P (N/cm) of the insulating resin layer satisfies $P/C_{max}>60$.

2. The heat sink integrated insulating circuit substrate according to claim 1, wherein a ratio $t_C/t_H$ between a thickness $t_C$ of the circuit layer and a thickness $t_H$ of the top plate part of the heat sink satisfies the following expression, $0.5 \leq t_C/t_H \leq 1.5$.

3. The heat sink integrated insulating circuit substrate according to claim 2,
wherein the ratio $P/C_{max}$ between the maximum curvature $C_{max}$ (1/m) of the heat sink during heating from 25° C. to 300° C. and the peel strength P (N/cm) of the insulating resin layer satisfies $P/C_{max} > 90$.

4. The heat sink integrated insulating circuit substrate according to claim 3,
wherein the insulating resin layer contains a filler of an inorganic material.

5. The heat sink integrated insulating circuit substrate according to claim 2,
wherein the insulating resin layer contains a filler of an inorganic material.

6. The heat sink integrated insulating circuit substrate according to claim 1,
wherein the ratio $P/C_{max}$ between the maximum curvature $C_{max}$ (1/m) of the heat sink during heating from 25° C. to 300° C. and the peel strength P (N/cm) of the insulating resin layer satisfies $P/C_{max} > 90$.

7. The heat sink integrated insulating circuit substrate according to claim 6,
wherein the insulating resin layer contains a filler of an inorganic material.

8. The heat sink integrated insulating circuit substrate according to claim 1,
wherein the insulating resin layer contains a filler of an inorganic material.

* * * * *